United States Patent
Hawryluk et al.

(10) Patent No.: US 9,613,815 B2
(45) Date of Patent: Apr. 4, 2017

(54) HIGH-EFFICIENCY LINE-FORMING OPTICAL SYSTEMS AND METHODS FOR DEFECT ANNEALING AND DOPANT ACTIVATION

(71) Applicant: Ultratech, Inc., San Jose, CA (US)

(72) Inventors: Andrew M. Hawryluk, Los Altos, CA (US); Serguei Anikitchev, Hayward, CA (US)

(73) Assignee: Ultratech, Inc., San Jose, CA (US)

( * ) Notice: Subject to any disclaimer, the term of this patent is extended or adjusted under 35 U.S.C. 154(b) by 11 days.

(21) Appl. No.: 14/929,186

(22) Filed: Oct. 30, 2015

(65) Prior Publication Data

US 2016/0148810 A1   May 26, 2016

Related U.S. Application Data

(60) Provisional application No. 62/083,537, filed on Nov. 24, 2014.

(51) Int. Cl.
| | |
|---|---|
| *H01L 21/268* | (2006.01) |
| *H01L 21/263* | (2006.01) |
| *B23K 26/00* | (2014.01) |
| *B23K 26/06* | (2014.01) |
| *B23K 103/00* | (2006.01) |

(52) U.S. Cl.
CPC ........ *H01L 21/268* (2013.01); *B23K 26/0066* (2013.01); *B23K 26/0626* (2013.01); *H01L 21/2636* (2013.01); *B23K 2203/56* (2015.10)

(58) Field of Classification Search
CPC .............. H01L 21/268; H01L 21/2636; B23K 26/0066; B23K 26/0648
See application file for complete search history.

(56) References Cited

U.S. PATENT DOCUMENTS

| | | | |
|---|---|---|---|
| 3,476,463 A | 11/1969 | Kreuzer | |
| 3,980,397 A | 9/1976 | Judd et al. | |
| (Continued) | | | |

FOREIGN PATENT DOCUMENTS

| | | |
|---|---|---|
| JP | H06234092 | 8/1994 |
| JP | H07-185863 | 7/1995 |
| (Continued) | | |

OTHER PUBLICATIONS

Office Action from Japanese Patent Office dated Nov. 30, 2016, for JP Application No. 2015-225403.

*Primary Examiner* — Fernando L Toledo
*Assistant Examiner* — Neil Prasad
(74) *Attorney, Agent, or Firm* — Opticus IP Law PLLC

(57) ABSTRACT

High-efficiency line-forming optical systems and methods for defect annealing and dopant activation are disclosed. The system includes a $CO_2$-based line-forming system configured to form at a wafer surface a first line image having between 2000 W and 3000 W of optical power. The line image is scanned over the wafer surface to locally raise the temperature up to a defect anneal temperature. The system can include a visible-wavelength diode-based line-forming system that forms a second line image that can scan with the first line image to locally raise the wafer surface temperature from the defect anneal temperature to a spike anneal temperature. Use of the visible wavelength for the spike annealing reduces adverse pattern effects and improves temperature uniformity and thus annealing uniformity.

13 Claims, 7 Drawing Sheets

(56) References Cited

U.S. PATENT DOCUMENTS

| | | | |
|---|---|---|---|
| 4,158,176 | A | 6/1979 | Hunt et al. |
| 4,605,606 | A | 8/1986 | Ferrante |
| 4,832,446 | A | 5/1989 | Miyagawa |
| 5,048,938 | A | 9/1991 | Hizny |
| 5,116,110 | A | 5/1992 | Kahn |
| 5,331,466 | A | 7/1994 | Saarloos |
| 5,768,017 | A | 6/1998 | King et al. |
| 5,959,779 | A | 9/1999 | Yamazaki et al. |
| 6,548,781 | B1 | 4/2003 | Brunwikel |
| 6,717,105 | B1 | 4/2004 | Okamoto et al. |
| 6,987,240 | B2 | 1/2006 | Jennings et al. |
| 7,110,171 | B2 | 9/2006 | Dane et al. |
| 7,148,159 | B2 | 12/2006 | Talwar et al. |
| 7,199,330 | B2 | 4/2007 | DeMaria et al. |
| 8,014,427 | B1 | 9/2011 | Anikitchev |
| 8,309,474 | B1 | 11/2012 | Wang et al. |
| 8,320,056 | B2 | 11/2012 | Erlandson |
| 8,546,805 | B2 | 10/2013 | Shen et al. |
| 8,785,815 | B2 | 7/2014 | Sade et al. |
| 9,411,163 | B2 | 8/2016 | Anikitchev |
| 2007/0072400 | A1 | 3/2007 | Bakeman |
| 2012/0111838 | A1 | 5/2012 | Zafiropoulo et al. |

FOREIGN PATENT DOCUMENTS

| | | |
|---|---|---|
| JP | H08-125258 | 5/1996 |
| JP | 2009-031684 | 2/2009 |

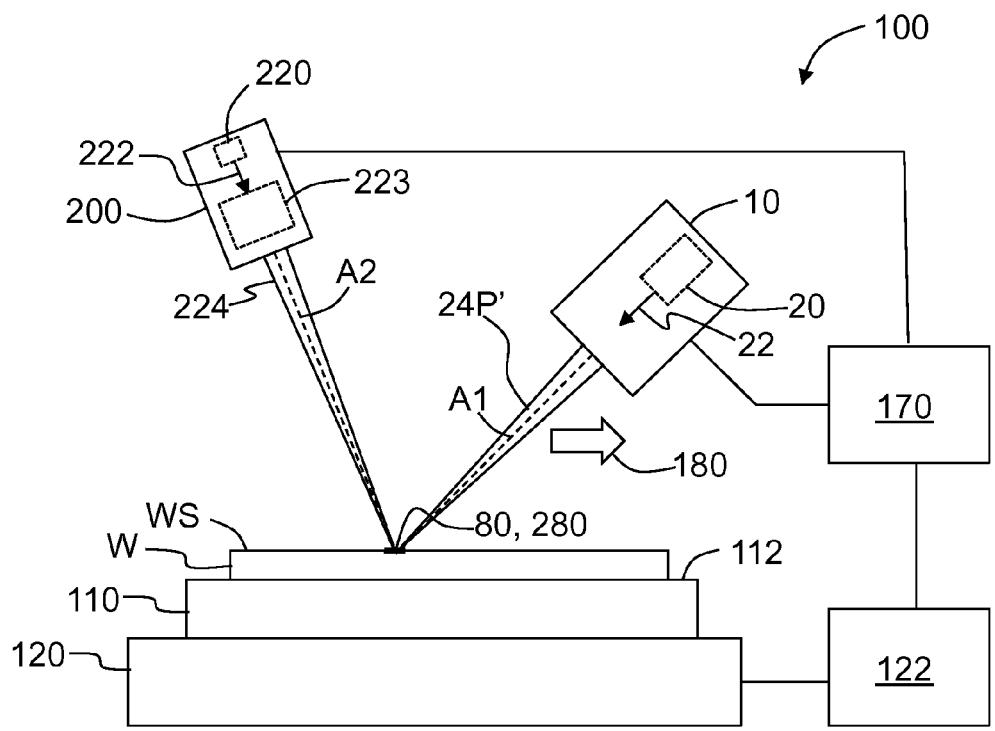
FIG. 7
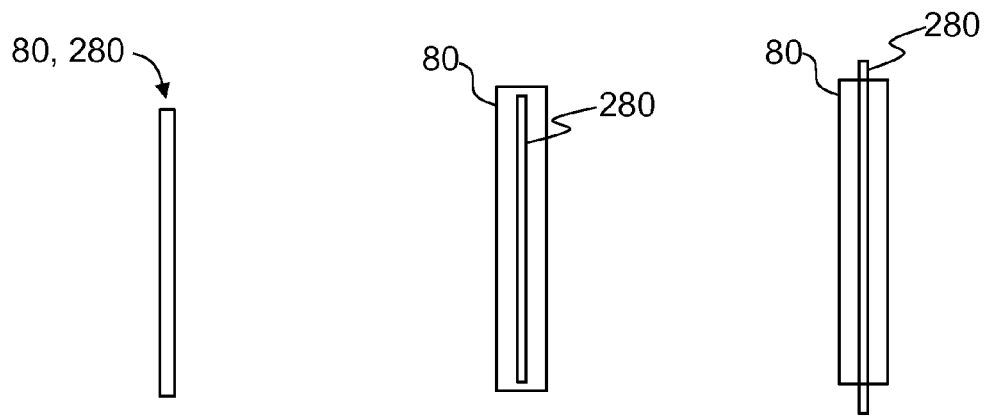
FIG. 8A  FIG. 8B  FIG. 8C

HIGH-EFFICIENCY LINE-FORMING OPTICAL SYSTEMS AND METHODS FOR DEFECT ANNEALING AND DOPANT ACTIVATION

CROSS-REFERENCE TO RELATED APPLICATIONS

This Application is related to U.S. Provisional Patent Application Ser. No. 62/030,391, entitled "High-efficiency line-forming optical systems and methods," which is incorporated by reference herein.

This Application also claims priority from U.S. Provisional Patent Application Ser. No. 62/083,537, filed on Nov. 24, 2014, and which is incorporated by reference herein.

FIELD

The present disclosure relates to optical systems for forming a line image, and in particular relates to high-efficiency line-forming optical systems and methods for defect annealing and dopant activation.

The entire disclosure of any publication or patent document mentioned herein is incorporated by reference, including the following: U.S. Pat. No. 8,014,427; US 2012/0111838; US 2007/0072400; U.S. Pat. Nos. 7,148,159; 8,546,805; 8,865,603; 8,309,474; and U.S. patent application Ser. No. 14/497,006.

BACKGROUND

A variety of applications require the use a uniform line image formed from a high-power laser beam. One such application is laser thermal processing (LTP), also referred to in the art as laser spike annealing (LSA) or just "laser annealing," which is used in semiconductor manufacturing to activate dopants in select regions of a semiconductor wafer when forming active microcircuit devices such as transistors.

One type of laser annealing uses a scanned line image formed from a laser beam to heat the surface of the wafer to a temperature (the "annealing temperature") for a time long enough to activate the dopants but short enough to minimizing dopant diffusion. The time that the wafer surface is at the annealing temperature is determined by the power density of the line image, as well as by the line-image width divided by the velocity at which the line image is scanned (the "scan velocity").

One type of high-power laser that is used for laser annealing applications is $CO_2$ laser. Traditional methods of performing laser annealing with a $CO_2$ laser including imaging the light beam onto a pair of knife-edges and then relaying the light passing therethrough to an image plane to form the line image. The knife-edges are positioned to transmit only a narrow central portion (e.g., 10%) of a Gaussian laser beam for which the intensity is relatively uniform so that the resulting line image is also relatively uniform along the length of the line image.

Unfortunately, using only the narrow central portion of the laser beam means that the other 90% of the light beam is rejected. This is a very inefficient use of the high-intensity laser light. On the other hand, the conventional wisdom is that trying to pass a larger portion of the Gaussian beam will naturally result in non-uniformity of the line image along its length because of the substantial drop off in intensity in the Gaussian beam with distance from the center of the beam.

Furthermore, there are applications where it is advantageous to perform a defect anneal and a spike anneal simultaneously. In this regard, the $CO_2$ laser beam is combined with a broader laser beam, typically from a diode laser. The broader laser beam raises the temperature of the surrounding area to an intermediate temperature for a longer period of time than the $CO_2$ beam, which is used to "spike" the surface to about 1300° C. for a millisecond or less. Typically, the broader laser beam will heat the region for several milliseconds (e.g., in the range from 2 milliseconds to 20 milliseconds) to an intermediate temperature between 700 and 1200° C. The total power required by the diode laser to heat the substrate to this temperature and temporal range is large, e.g., typically several killowatts (kW). Integrating these two laser beam is typically challenging. In a conventional system, the $CO_2$ laser beam and the diode laser beam are not collinear because the optics required to deliver the beams to the wafer are significantly different.

In addition, an important constraint in the design of the laser annealing tool is the avoidance of the incoming laser beam onto the sidewall of the wafer. The laser beams are incident to the surface of the wafer at Brewster's Angle, which is about 70° for silicon. At this incident angle, the power density on the side of the wafer is greater than three times the power density on the wafer surface, and can damage, or even break, the wafer. It has been shown in U.S. Pat. No. 8,071,908 that a serrated skirt can protect the sidewall of the wafer with an incident $CO_2$ laser beam. However, the additional (diode) laser also needs to avoid the sidewall of the wafer because the diode laser provides a large amount of power, e.g., 3 kW typically. It turns out that, geometrically, it is an over constrained problem to design a skirt to protect the wafer from a $CO_2$ laser incident from one direction, and a diode laser incident at nominally 90 degrees from the $CO_2$ laser beam. Hence, it becomes impracticable to use a diode laser with such high power without taking costly and/or time-consuming steps to avoid damaging or breaking wafers.

A further disadvantage of the above approach comes from "pattern effects". Pattern effects are temperature non-uniformities that arise due to patterns on the wafer. The patterns are features of the devices and interconnections being formed. The pattern effects are much more significant when the incident laser has a shorter wavelength (i.e., closer to visible wavelengths of light) because the pattern effects are driven by Raleigh scattering, which scales as the ratio of feature or pattern size δ divided by the wavelength λ, raised to the fourth power, e.g., $(\delta/\lambda)^4$.

SUMMARY

Aspects of the disclosure are directed to systems for and methods of performing defect annealing with a $CO_2$ laser while other aspects include additionally performing laser spike annealing using a visible diode laser. For defect annealing performed in conjunction with laser spike annealing, the $CO_2$ laser is used to provide the majority of the temperature rise of the wafer surface (e.g., up to at least the defect anneal temperature) and the diode laser is used to provide additional heating to bring the local temperature up to the anneal (i.e., dopant activation) temperature. In an example, the amount of the temperature rise provided by the diode laser is as small as possible. This is advantageous because the wavelength of the $CO_2$ laser is roughly 10× to 20× longer than the wavelength of a visible diode laser. Consequently, the adverse pattern effects are much smaller with the $CO_2$ laser than with the visible diode laser. The method includes using the $CO_2$ laser for the initial, relatively long-duration temperature rise for defect annealing, and then using the diode laser for the relative short spike annealing, i.e., for dopant activation. This requires that the $CO_2$ laser power delivered to the wafer be substantial, e.g., in the range from 2000 W to 3000 W (i.e., 2 kW to 3 kW), while also having acceptable intensity uniformity, e.g., within +/−5%, over a usable beam length (e.g., in the range from 5 mm to 100 mm) and beam width (e.g., in the range from 25 μm to 1 mm). It is noted that while a raw $CO_2$ laser beam might be able to provide the needed power, it will have a Gaussian intensity profile that cannot provide the required intensity uniformity over a usable beam length.

Besides mitigating the adverse pattern effects, another advantage of the systems and methods disclosed herein is that power density incident upon on the sidewall of the wafer from the visible-wavelength light beam is also reduced (e.g., to a sub-kW value), thereby reducing the risk of wafer damage or breakage due to irradiation of the wafer edge or side wall.

An aspect of the disclosure is a method of performing defect annealing at a defect anneal temperature $T_D$ of a semiconductor wafer having a surface that includes a pattern, wherein the method includes: forming from a $CO_2$ laser a light beam having a wavelength of nominally 10.6 microns and a first intensity profile with a Gaussian distribution in at least a first direction; passing at least 50% of the light beam in the first direction to form first transmitted light; focusing the first transmitted light at an intermediate focal plane to define a second intensity profile having a central peak and first side peaks immediately adjacent the central peak; truncating the second intensity profile within each of first side peaks to define second transmitted light that forms on the wafer surface a first line image having between 2000 W and 3000 W of optical power and an intensity uniformity of within +/−5% over a first line length in the range from 5 mm to 100 mm; and scanning the first line image over the wafer surface to locally raise a temperature of the wafer surface to the defect anneal temperature.

Another aspect of the disclosure is the method described above, wherein the defect anneal temperature $T_D$ is in the range 650° C.$\leq T_D \leq$1100° C.

Another aspect of the disclosure is the method described above, further including performing spike annealing at a spike anneal temperature by: forming a second line image at the wafer surface using a second light beam having a visible wavelength, wherein the second line image at least partially overlaps the first line image; and scanning the second line image to locally raise the temperature of the wafer surface from the defect anneal temperature $T_D$ to the spike anneal temperature $T_A$.

Another aspect of the disclosure is the method described above, wherein the spike anneal temperature $T_A$ is in the range 1150° C.$\leq T_A \leq$1350° C.

Another aspect of the disclosure is the method described above, wherein the first line image has a first width and the second line image has a second width that is between 5% and 25% of the first width.

Another aspect of the disclosure is the method described above, wherein the first width is in the range from 25 microns to 1 mm.

Another aspect of the disclosure is the method described above, including forming the second light beam using a laser diode light source and line-forming optics arranged relative thereto.

Another aspect of the disclosure is the method described above, wherein the second wavelength is between 500 nm and 1000 nm.

Another aspect of the disclosure is the method described above, wherein the second line image has a second line length in the range between 5 mm and 100 mm and an intensity uniformity of within +/−5%.

Another aspect of the disclosure is the method described above, wherein the wafer surface temperature has a variation from the spike anneal temperature due to pattern effects, and wherein the variation is no more than 60° C.

Another aspect of the disclosure is a system for performing defect annealing of a semiconductor wafer having a surface with a pattern. The system includes: a $CO_2$ laser source that emits an initial light beam having a wavelength of nominally 10.6 microns; a beam-conditioning optical system that receives the initial light beam and forms therefrom a conditioned light beam having a first intensity profile with a Gaussian distribution in at least a first direction; a first aperture device operably disposed at an object plane and that defines a first slit aperture that truncates the first intensity profile in the first direction to define first transmitted light that constitutes at least 50% of the conditioned light beam; a relay optical system that defines the object plane and that also defines an intermediate focal plane at which is operably disposed a second aperture device, the relay optical system defining at the intermediate focal plane a second intensity profile having a central peak and first side peaks immediately adjacent the central peak, wherein the second aperture device is configured to truncate the second intensity profile in the first direction and within each of the first side peaks to define second transmitted light; wherein the relay optical system forms from the second transmitted light a first line image at the wafer surface, wherein the first line image includes between 2000 W and 3000 W of optical power, has a first length in the range from 5 mm to 100 mm, and has an intensity uniformity of within +/−5%; a chuck that operably supports the wafer; and a moveable wafer stage that operably supports the chuck and that is configured to move the chuck and the wafer supported thereon so that the first line image scans over the wafer surface to locally raise a temperature of the wafer surface to a defect anneal temperature.

Another aspect of the disclosure is the system described above, wherein the defect anneal temperature is in the range from 650° C. to 1100° C.

Another aspect of the disclosure is the system described above, wherein the chuck is heated so that it can pre-heat the wafer.

Another aspect of the disclosure is the system described above, further including a diode-based line-forming optical system that generates a visible light beam that forms at the wafer surface a second line image that at least partially overlaps and scans with the first line image to locally raise the temperature of the wafer surface from the defect annealing temperature to a spike anneal temperature, and wherein the second line image has an intensity variation of within +/−5%.

Another aspect of the disclosure is the system described above, wherein the spike anneal temperature is in the range from 1150° C. to 1350° C.

Another aspect of the disclosure is the system described above, wherein the first and second line images have respective first and second widths, and wherein the second width is in the range from 5% to 25% of the first width.

Another aspect of the disclosure is the system described above, wherein each side peak is defined by a maximum value MX and first and second minimum values m1 and m2, and wherein the second slit aperture is configured to truncate the second intensity profile between the maximum value MX and the second minimum value m2 in each first side peak.

Another aspect of the disclosure is the system described above, wherein the relay optical system has substantially 1× magnification in the first direction.

Another aspect of the disclosure is the system described above, wherein the relay optical system is a cylindrical optical system having optical power only in the first direction.

Another aspect of the disclosure is the system described above, wherein the optical relay system consists of reflective optical components only.

Another aspect of the disclosure is the system described above, wherein the first aperture device comprises a pair of blades operably disposed in the object plane.

Another aspect of the disclosure is the system described above, wherein the second aperture device comprises a pair of blades operably disposed in the intermediate focus plane.

Another aspect of the disclosure is the system as described above, wherein the diode-based line-forming optical system includes a laser diode light source and line-forming optics arranged relative thereto.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIG. 7 is similar to FIG. 6 and illustrates an example of a laser annealing system that can be used to perform defect annealing and spike annealing; and FIGS. 8A through 8C are close-up views of the line images formed by the $CO_2$-based line-forming optical system and the diode-based line-forming optical system, illustrating different examples of the relative positions of the two line images at the wafer surface.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation. Further, the Cartesian coordinates at the second aperture device 60 are denoted x' and y' to distinguish from the (x,y) coordinates at the first aperture device 40 and at the image plane IP.

In the discussion below, the terms "laser beam" and "light" are used interchangeably. Also, the term "micron" and the symbol "μm" are used interchangeably.

The terms "upstream" and "downstream" are used to refer to the location of an item relative to direction of light travel as conventionally used in the art of optical system design, wherein when item B is said to be downstream of item A, light travels in the direction from item A to item B, and vice versa.

Line-forming Optical System

Figure 1:
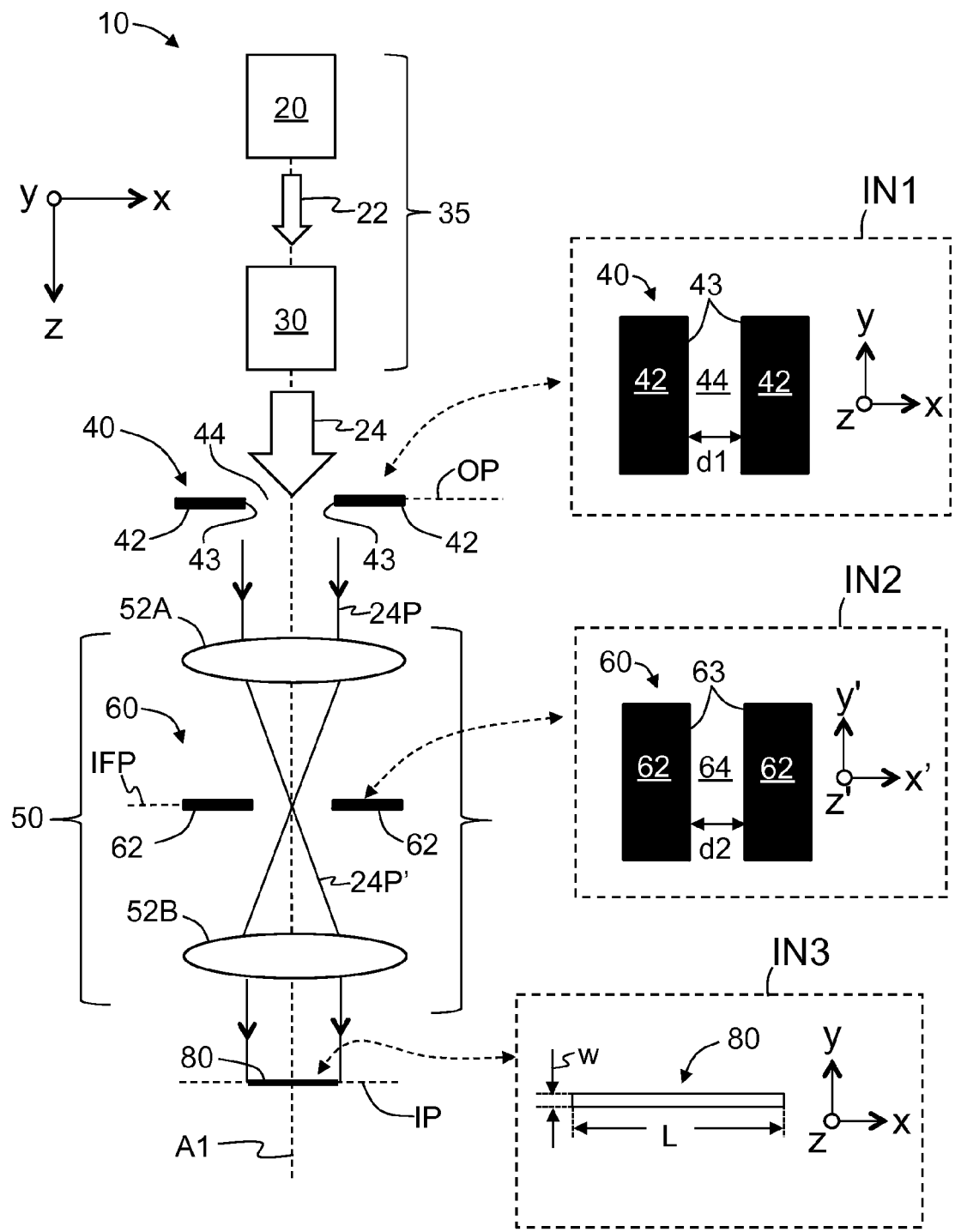
FIG. 1 is a schematic diagram of an example line-forming optical system according to the disclosure.

FIG. 1 is a schematic diagram of an example line-forming optical system ("system") 10 according to the disclosure. System 10 includes an optical axis A1, an object plane OP and an image plane IP at which a line image 80 is formed as described below.

System 10 includes along optical axis A1 and upstream from object plane OP a laser source 20 that emits an initial laser (light) beam 22 along the optical axis towards the object plane. In an example, laser source 20 includes a $CO_2$ laser that operates at a nominal wavelength of 10.6 μm. In an example, initial laser beam 22 has a Gaussian intensity distribution (profile) at along least the x-direction, and further in an example in both the x-direction and the y-direction. In an example, initial laser beam 22 need not be circularly symmetric, e.g., the Gaussian intensity distributions in the x-direction and y-direction can have different sizes. In an example, laser source 20 outputs about 3500 W of optical power in initial laser beam 22.

System 10 also includes a beam-conditioning optical system 30 arranged along axis A1 between laser source 20 and object plane OP. The beam-conditioning optical system 30 is configured to receive laser beam 22 and form therefrom a conditioned laser (light) beam 24. In an example, beam-conditioning optical system 30 is configured to perform beam expansion so that conditioned laser beam 24 is an expanded version of initial laser beam 22. In an example, beam-conditioning optical system 30 is configured to provide conditioned laser beam 24 with a select dimensions (profiles) in the x-direction and the y-direction. In an example, beam-conditioning optical system 30 expands the dimensions of initial laser beam 22 by the same amount in the x-direction and the y-direction.

Beam-conditioning optical system 30 can include at least one of mirrors, lenses, apertures, and like optical components. An example beam-conditioning optical system 30 utilizes two or more off-axis mirrors each having optical power such as known in the art and two examples of which are described in U.S. Pat. Nos. 2,970,518 and 3,674,334. In various examples, beam-conditioning optical system 30 can be anamorphic, cylindrical or circularly symmetric.

In an example embodiment, laser source 20 and beam-conditioning optical system 30 define a laser source system 35 that generates the desired intensity profile $I(x,y)$ for conditioned laser beam 24 for forming line image 80. In an example where laser source 20 emits a suitable initial laser beam 22 that does not need to be conditioned, then beam-conditioning optical system 30 is not required and the initial laser beam can be used in place of a conditioned laser beam. Thus, in the discussion below, conditioned laser beam is understood in an example to be defined by an unprocessed initial laser beam 22.

System 10 also includes along axis A1 and at object plane OP a first aperture device 40. In an example, first aperture device 40 is includes a pair of blades 42 each having an edge 43. The blades 42 are disposed in object plane OP on respective sides of axis A1 so that their respective edges 43 are opposing and spaced apart to form a slit aperture 44. Slit aperture 44 has its long dimension in the Y-direction, as best seen in the close-up inset IN1, which shows first aperture 40 device as at appears looking down optical axis A1 in the +z direction. The slit aperture 44 has a width d1 in the x-direction that defines a length L of line image 80 formed by system 10 at image plane IP, as described below. In an example, blades 42 are movable to adjust the width d1 and thus the length L of line image 80.

System 10 also includes long axis A1 and downstream of first aperture device 40 a relay optical system 50. The relay optical system 50 shown in FIG. 1 is shown as a transmission optical system for ease of illustration. An example of a reflective relay optical system 50 is described below in connection with FIG. 5. Relay optical system 40 includes first and second optical components 52A and 52B. In example, each optical component 52A and 52B can consist of one or more optical elements, such as lenses, mirrors, etc. Relay optical system 50 defines the object plane OP at first aperture device 40 resides and also defines the image plane IP at which line image 80 is formed.

Relay optical system 50 further includes a second aperture device 60 arranged between first and second optical components 52A and 52B at an intermediate focal plane IFP defined by optical component 52A. With reference to the second close-up inset IN2, second aperture device 60 includes a pair of blades 62 each having an edge 63. The blades 62 are disposed in intermediate focal plane IFP on respective sides of axis A1 so that their respective edges 63 are opposing and spaced apart to form a slit aperture 64. Slit aperture 64 has its long dimension in the y'-direction, i.e., in the same direction as slit aperture 44 of the first aperture system 40. The slit aperture 64 has a width d2 in the x'-direction. In an example, blades 62 are movable to adjust the width d2.

In an example embodiment, relay optical system 50 has substantially unit magnification (i.e., is substantially a 1× system) in the x-z plane. Also in examples, relay optical system 50 can be either cylindrical or anamorphic. The width d1 of slit aperture 44 of first aperture device 40 defines the size of conditioned laser beam 24 in the x-direction, and for 1× magnification in the x-z plane, d1=L (see close-up inset IN3).

Figure 2A:
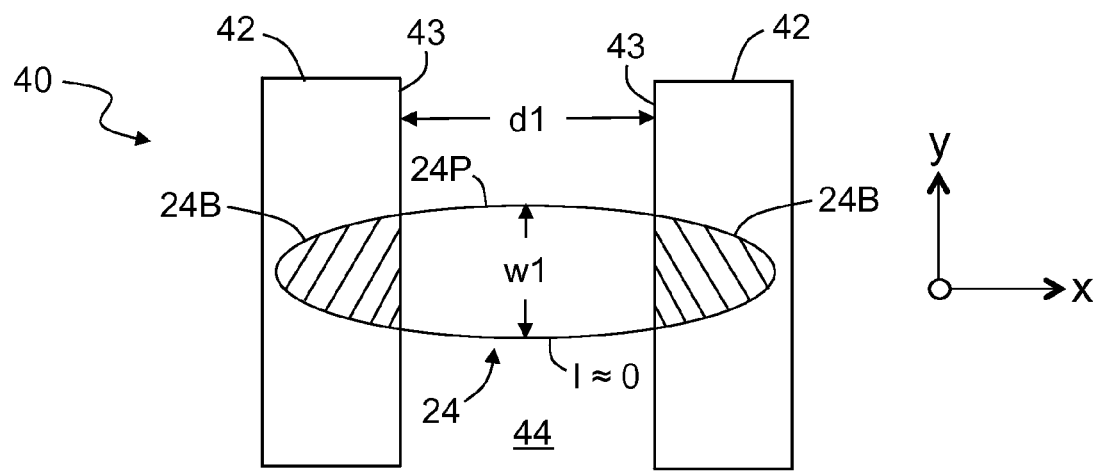
FIG. 2A is a front-on view of the first aperture device 40 of the example line-forming optical system of FIG. 1 as seen looking in the +z direction and shows the approximate zero-intensity contour ($I(x,y) \approx 0$) of the conditioned laser beam as it is incident up the first aperture.

In the general operation of system 10, conditioned laser beam 24 is formed and first aperture device 40 is configured so that a relatively large amount of the light in this beam passes through slit aperture 44. FIG. 2A is a front-on view of first aperture device 40 (looking in the +z direction) and shows the approximate zero-intensity contour $(I(x,y)\approx 0)$ of conditioned laser beam 24. In an example, conditioned laser beam 24 has a Gaussian profile in the x-direction and y-direction, with the profile being longer in the x-direction (i.e., the intensity profile $I(x,y)$ is elongate in the x-direction). As noted above, the width w1 of the Gaussian profile in the y-direction defines the width w (short dimension) of line image 80. In an example, width w1 is defined by beam-conditioning optical system 30, with relay optical system 50 having no optical power in the y-z plane (i.e., the relay optical system is cylindrical with optical power in the x-z plane only). This is one advantage of using a beam-conditioning optical system 30, since it avoids having to form optical components 52A and 52B using anamorphic elements.

Figure 2B:
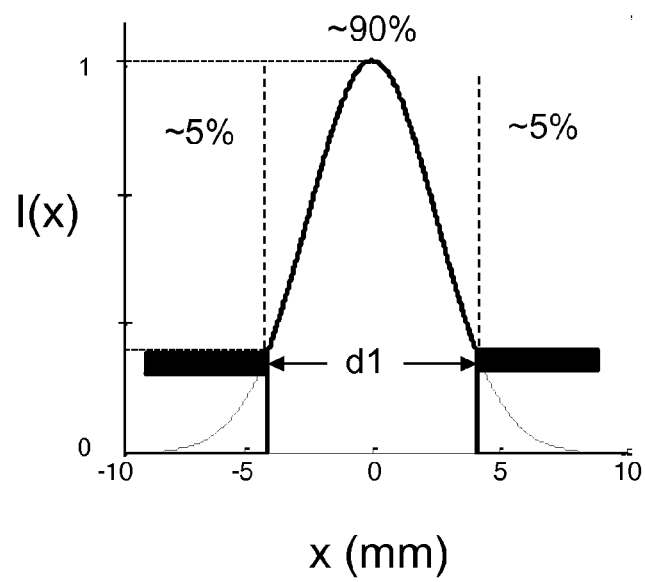
FIG. 2B is a plot of the intensity $I(x)$ versus $x(mm)$ of the conditioned laser beam and shows the location of the opposing first blades of first aperture device relative to the conditioned laser beam.

FIG. 2B is a plot of the intensity $I(x)$ versus x (mm) of conditioned laser beam 24 that also shows an example location of blades 42 of first aperture device 40 relative to the conditioned laser beam. The hashed portions 24B of conditioned laser beam 24 in FIG. 2A shows the portions of the conditioned laser beam that are block by the respective blades 42, while the portion that passes through slit aperture 44 is denoted 24P, which is also referred to below as "first transmitted light." This is also illustrated in FIG. 2B, wherein the dashed-line portion of the intensity profile $I(x)$ shows the portion of the light that is blocked by respective blades 42. In the example illustrated in FIGS. 2A and 2B, about 90% of the light in conditioned laser beam 24 passes through slit aperture 44 as first transmitted light 24P, while about 10% of the light of conditioned laser beam at the wings of the intensity profile is blocked by blades 42. In an example, first aperture device 40 is configured to pass at least 50% of conditioned laser beam 24.

Because first aperture device is configured to pass a substantial portion of conditioned laser beam 24, the variation in intensity $I(x)$ within slit aperture 44 is relative large. In an example, this variation greater than 50% while in another example is greater than 65% while in another example is greater than 70%. This can be seen most clearly in FIG. 2B, wherein the (normalized) peak intensity is 1 in the center of slit aperture 44 (i.e., at x=0) while the intensity drops off to about 0.28, i.e., to about 28% of the maximum value of $I(x)$ at the edges of slit aperture as defined by blade edges 43. If this intensity distribution is relayed to the image plane IP using convention relay means, line image 80 will have a corresponding variation in intensity uniformity (about 72%) in the long direction. This is far greater than the preferred intensity uniformity of within +/−5% or in some cases within +/−2%, over the length L of line image 80.

With reference again to FIG. 1, the first transmitted light 24P that passes through slit aperture 44 is focused onto second aperture device 60 at intermediate focal plane IFP by optical component 52A of relay optical system 50. IFP has coordinates x' and y' to distinguish from the (x,y) coordinates at the first aperture device 40. This focusing gives rise to a second intensity distribution I'(x',y'), which is defined by the 1-dimensional Fourier transform (in the x'-direction) of the intensity distribution 1(x,y) at the object plane OP.

The intensity distribution 1(x) at the object plane OP can be defined as (with (d1)/2=a):

$$I(x)=G(x)\cdot\text{rect}(x/a)$$

where rect (x/a) is: 0 for $|x|>a$; ½ for x=a; and 1 for $|x|<a$, and $G(x)=\exp(-x^2)$. Thus, I'(x) is given by:

$$I'(x')=F\{I(x)\}=F\{\text{rect}(x/a)\cdot\exp(-x^2)\}=$$
$$[a\cdot\text{sinc}(x'\cdot a/2)] \boxtimes [(\pi)^{1/2}\exp\{-\pi^2 x^2\}]$$

where the $\boxtimes$ symbol represents the convolution operation.

Figure 3A:
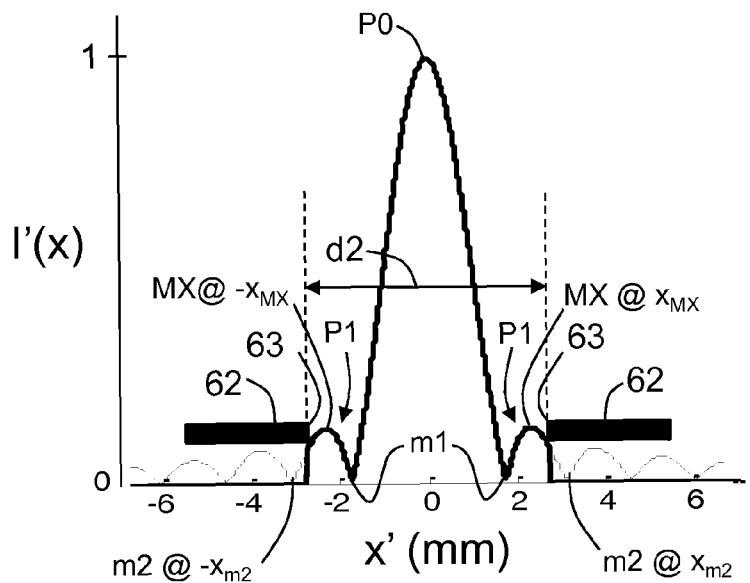
FIG. 3A is a plot of intensity distribution $I'(x')$ vs. $x'$ (mm) of the first transmitted light at the second aperture device, and shows an example position of the opposing second aperture blades of the second aperture device relative to the intensity distribution.
Figure 3B:
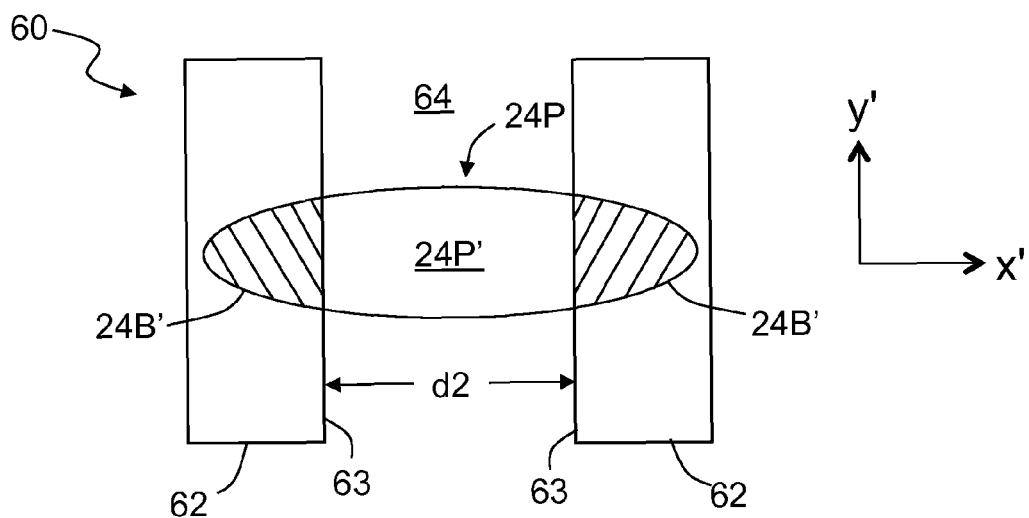
FIG. 3B is a front-on view of the second slit aperture device of FIG. 3A as looking in the +z direction in FIG. 1 and showing the first transmitted light incident thereon.

FIG. 3A is a plot of intensity distribution I'(x') vs. x' (mm) of the first transmitted light 24P at second aperture device 60. FIG. 3B is a front-on view of the second aperture device 60 of FIG. 3B as looking in the +z direction. With reference to FIG. 3B, the aperture blades 62 are arranged so that a portion 24P' of first transmitted light 24P that is incident upon second aperture device 60 passes through slit aperture 64 while respective portions 24B' of light 24P are block by blades 62. Light 24P' is thus referred to as "second transmitted light" and is used by the downstream portion of optical relay system 50 to form line image 80.

FIG. 3A shows details about where blades 62 can be set to have a select width d2 to pass a select amount of second transmitted light 24P'. The intensity profile I'(x) shows a strong central peak P0 surrounded by a number smaller peaks that diminish in size from the center of the profile. The first peaks on either side of the central peak P0 are denoted P1 and are defined by a maximum value MX surrounded by first and second minimum values (minima) m1 and m2. In an example, slit aperture 64 is defined to have a width d2 wherein each blade edge 63 resides within the corresponding first peak P1 so that the slit aperture transmits at least a portion of the light associated with first peaks P1.

In another example, second aperture device 60 is configured so that blade edges 63 reside within the corresponding first peak P1 between the maximum value MX and the second minimum m2. For example, if the x-values on the positive side of the x-axis are defined as $x_{MX}$ for the maximum value MX and $x_{m2}$ for the second minimum m2, and the x-position of edge 63 is defined as $x_{63}$, then the condition for the location of edge 63 of the positive-side blade 62 can be expressed as $x_{MX} \leq x_{63} \leq x_{m2}$. The corresponding condition for the edge 63 on the negative side blade can be expressed as: $-x_{m2} \leq -x_{63} \leq -x_{MX}$. It has been found that this spatial filtering condition provides the best results forming line image 80 with an acceptable level of intensity non-uniformity, e.g., to within +/−5% as measured in the long direction over length L.

In an example, the amount of first transmitted light 24P blocked by aperture device 60 at intermediate focal plane IFP is about 5 to 8% so that about 95 to 92% of the first transmitted light is transmitted to form the second transmitted light 24P'. This allows relay optical system 50 to form line image 80 at image plane IP with an efficiency of up to about 75% relative to the input power or intensity provided to object plane IP, as compared to the prior art efficiency of about 15%.

Furthermore, the intensity uniformity of line image 80 in the long direction (i.e., the x-direction) can satisfy in one example a tolerance of +/−5% in the long direction over length L and in another example can satisfy a tolerance of +/−2%.

Line image 80 is formed at image plane IP using second transmitted light 24P'. This light in the x-direction is defined as a truncation version of I'(x') and can be denoted as follows, wherein $F\{\cdot\}$ stands for the Fourier transform operation:

$$I'(x')=F\{I(x)\}\cdot\text{rect}(x'/b), \text{ where } b=(d2)/2.=[a\cdot\text{sinc}(x'\cdot a/2)] \boxtimes [(\pi)^{1/2}\exp\{-\pi^2 x^2\}]\cdot\text{rect}(x'/b).$$

The line image intensity distribution IL(x) is then the 1D inverse Fourier transform of I(x'), i.e., $$IL(x)=F^{-1}\{I'(x')\}.$$

From FIG. 3A, it can be seen that second aperture device 60 defines the 1D "rect" function in the expression for I'(x') above and serves to remove select amounts of the higher spatial-frequency components along the x' axis. Because these higher spatial-frequency components are needed to form a high-definition line image that includes the intensity variations of the input (conditioned) laser beam 24 at the first aperture device 40, their filtering by second aperture device 60 acts to smooth out the variation in intensity in the long direction of line image 80. On the other hand, because these higher spatial-frequency components have a relatively low intensity, most of the first transmitted light 24P makes it through aperture 64 to form the second transmitted light 24P'.

Figure 4A:
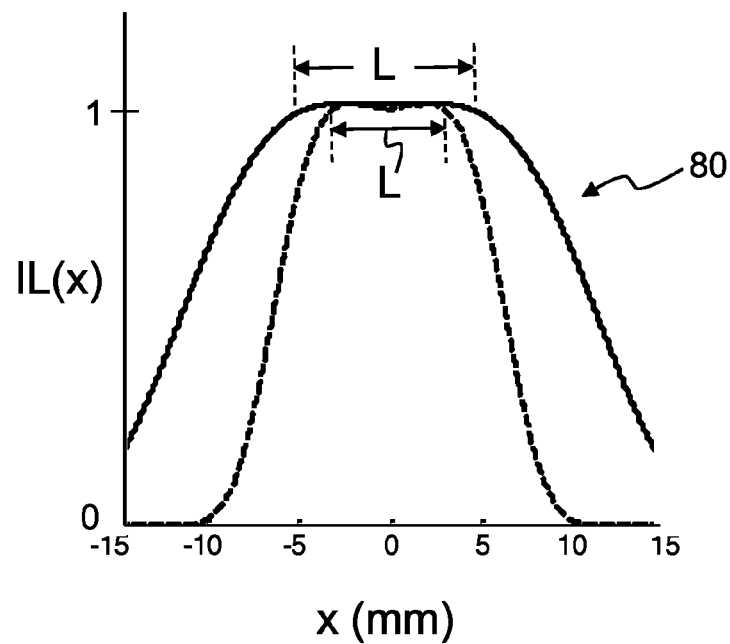
FIG. 4A is a plot of the intensity profile $IL(x)$ vs. x (mm) for the long direction of line image formed at the image plane by the second transmitted light and shows two different example sizes of lines of L=10 mm (solid line) and L=7.5 mm (dashed line) as formed by line-forming optical system of FIG. 1.

FIG. 4A is a plot of the intensity profile IL(x) vs. x (mm) for the long direction of line image 80 at image plane IP and shows by way of example two different sizes of lines of L=10 mm (solid line) and L=7.5 mm (dashed line) as formed by system 10. In an example, the length L of line image 80 can be in the range from 5 mm≤L≤100 mm.

Figure 4B:
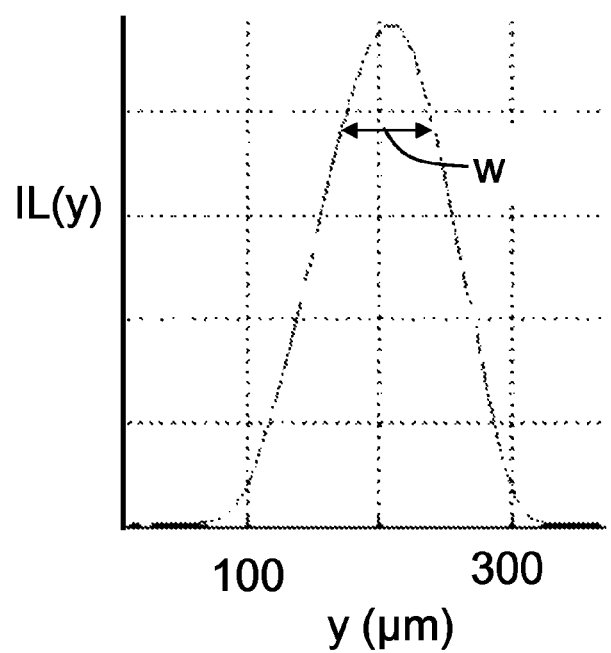
FIG. 4B is a plot of the intensity profile $IL(y)$ vs. y (μm) of the line image and shows that the intensity profile in the short direction (i.e., the y-direction) of the line image has a Gaussian shape that defines an example width w of about 75 μm.

FIG. 4B is a plot of the intensity profile IL(y) vs. y (μm) and shows that the intensity profile in the short direction (i.e., y-direction) of line image 80 has a Gaussian shape that defines an example width w of about 75 μm. In an example embodiment, width w can be in the range 25 μm≤w≤1000 μm or 25 μm≤w≤500 μm or 25 μm≤w≤250 μm. As noted above, in an example, with width w can be defined by beam-conditioning optical system 30 so that relay optical system 50 can be cylindrical with no optical power in the Y-Z plane.

Note that the intensity distribution IL(y) in the short dimension for line image 80 does not need to satisfy the same uniformity tolerance as the intensity distribution IL(x) in the long dimension in the case where the line image is scanned in the short direction, i.e., the y-direction. In such a case, the intensity variations in the y-direction average out during scanning. In the plot of IL(y) of FIG. 4B, line image 80 has a variation in intensity in the y-direction of about +/−10%.

Reflective Relay Optical System

Figure 5:
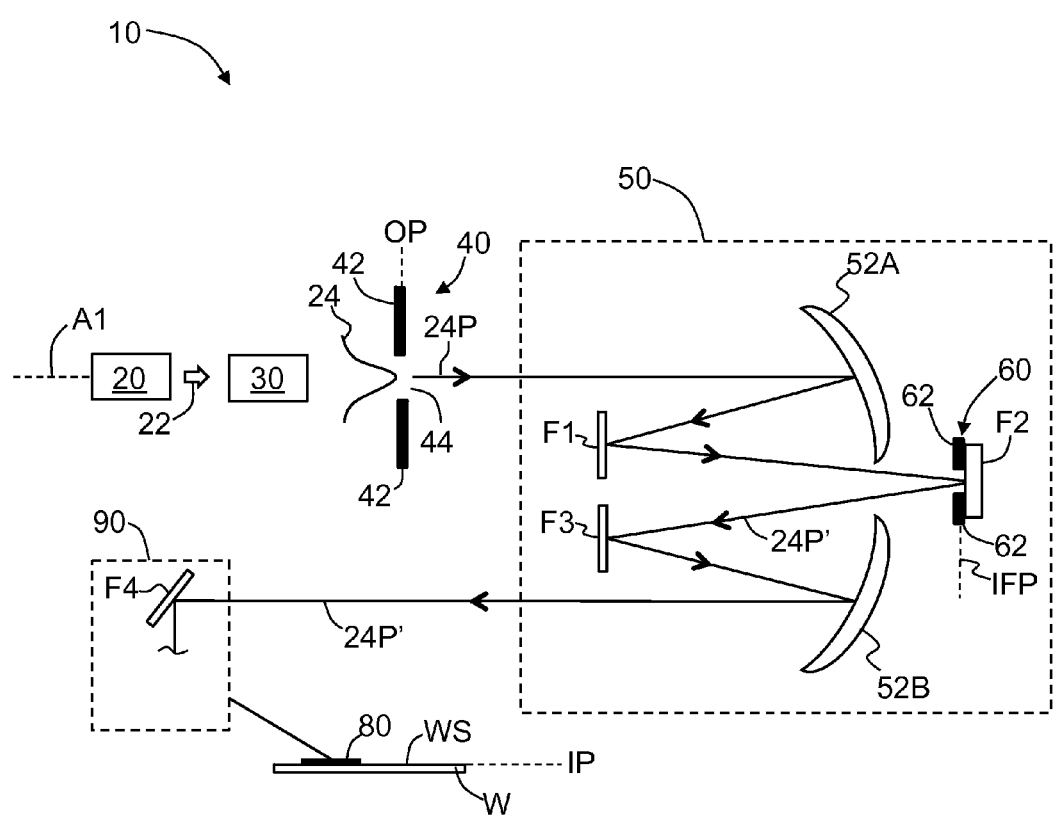
FIG. 5 is a schematic diagram of an example line-forming optical system that includes a reflective relay optical system.

FIG. 5 is a schematic diagram of an example system 10 that includes a reflective relay optical system 50 and a fold-mirror system 90 that is used to direct line image 80 to a surface WS of a wafer W arranged in image plane IP. The reflective relay optical system 50 includes first and second optical components 52A and 52B in the form of concave mirrors arranged in an off-axis configuration. Relay optical system 50 also includes fold mirrors F1, F2 and F3 that serve to fold the optical path of light 24P that passes through first aperture device 40 at object plane OP. Fold mirror F2 is arranged behind second aperture device 60 so that of the light 24P incident upon the second aperture device, only the center portion 24P' is reflected by fold mirror F2 to travel through the remainder of optical relay system 50. Thus, an example optical system 50 consists of reflective optical components, i.e., it has no refractive optical components. Such a configuration is desirable when laser source 20 operates at an infrared wavelength, such as the $CO_2$ laser wavelength of nominally 10.6 μm.

This second transmitted light 24P' is reflected by fold mirror F3 and directed to second optical component 52B, which directs the light to a fold-mirror optical system 90 that includes at least one fold mirror F4. In an example, fold-mirror optical system 90 is configured to compensate for the object plane and image plane OP not being parallel so that line image 80 is properly imaged onto wafer surface WS.

Laser Annealing System

Figure 6:
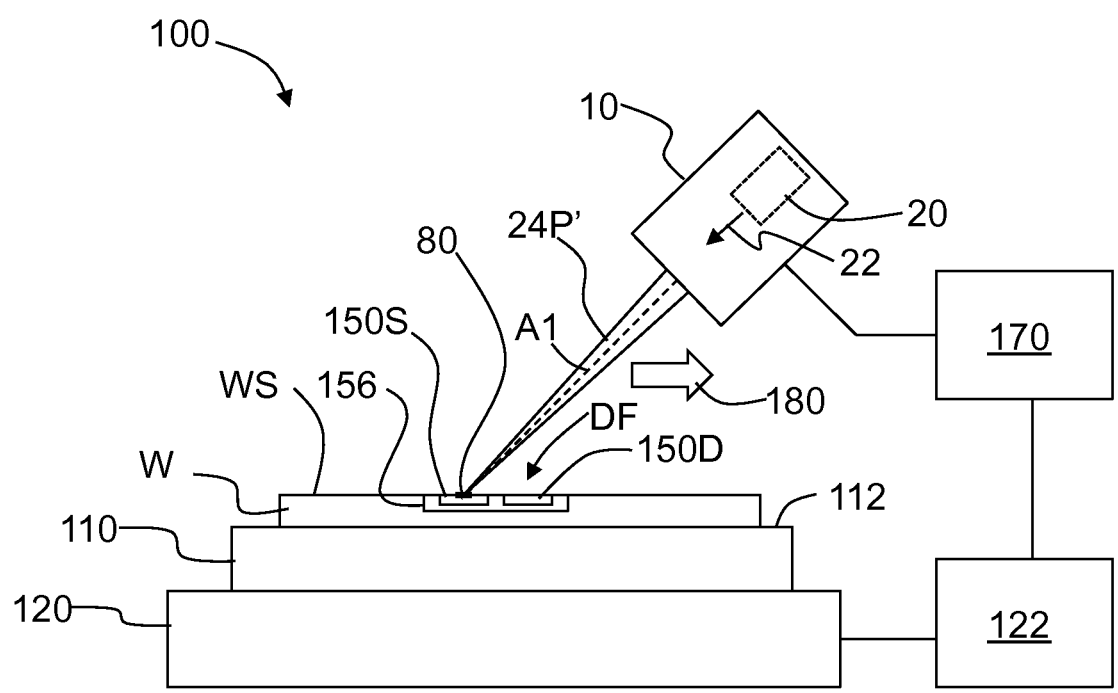
FIG. 6 is a schematic diagram of an example laser annealing system that includes the line-forming optical system of FIG. 1 as disclosed herein.

FIG. 6 is a schematic diagram of an example laser annealing system 100 that includes the line-forming optical system 10 disclosed herein. An example laser annealing system for which the line-forming optical system 10 is suitable for use is described in, for example, U.S. Pat. Nos. 7,612,372; 7,514,305; 7,494,942; 7,399,945; 7,154,066; 6,747,245; and 6,366,308.

Laser annealing system 100 of FIG. 6 includes, along optical axis A1, the line-forming optical system 10 as described above, wherein initial light beam 22 emitted by laser 20 (see also FIG. 1) has a wavelength (e.g., nominally 10.6 microns from a $CO_2$ laser) that is absorbed by and is capable of heating wafer W under select conditions. Such conditions include, for example, heating wafer W, or irradiating the wafer with a second radiation beam (not shown) having a bandgap energy greater than the semiconductor bandgap energy of the wafer, thereby causing the wafer to absorb light beam 22 to a degree sufficient to heat the wafer to annealing temperatures. An example of irradiating the wafer with a second laser source to make the wafer absorbent to light beam 22 is described in U.S. Pat. Nos. 7,098,155, 7,148,159 and 7,482,254.

Wafer W is supported by a chuck 110 having an upper surface 112. In an example, chuck 110 is configured to heat wafer W. Chuck 110 in turn is supported by a stage 120 that in turn is supported by a platen (not shown). In an example embodiment, chuck 110 is incorporated into stage 120. In another example embodiment, stage 120 is movable, including being translatable and rotatable. In an example, chuck 110 is used to pre-heat the wafer, e.g., up to a few hundred degrees or so.

Wafer W is shown by way of example as having device features DF in the form of source and drain regions 150S and 150D formed at or near wafer surface WS as part of a circuit (e.g., transistor) 156 formed in wafer W. Note that the relative sizes of the source and drain regions in circuit 156 compared to wafer W are greatly exaggerated for ease of illustration. In practice, source and drain regions 150S and 150D are very shallow, having a depth into the substrate of about one micron or less. In an example, wafer surface WS includes patterns defines by device structures formed in the wafer as part of the device manufacturing process. The patterns give rise to the aforementioned adverse pattern effects that can result in temperature non-uniformities when the wavelength λ of light irradiating the wafer surface WS is less than about 50 times the size δ of the patterns.

In an example embodiment, apparatus 100 further includes a controller 170 electrically connected to system 10 and to a stage controller 122. Stage controller 122 is electrically coupled to stage 120 and is configured to control the movement of the stage via instructions from controller 170. Controller 170 is configured coupled to control the operation of apparatus 100 generally, and in particular laser 20 and stage controller 122.

In an example embodiment, controller 170 is or includes a computer, such as a personal computer or workstation, available from any one of a number of well-known computer companies such as Dell Computer, Inc., of Austin Tex. Controller 170 preferably includes any of a number of commercially available micro-processors, a suitable bus architecture to connect the processor to a memory device, such as a hard disk drive, and suitable input and output devices (e.g., a keyboard and a display, respectively).

With continuing reference to FIG. 6, light beam 24P' generated as described above is directed onto wafer surface WS to form line image 80 thereon. It is noted that the term "image" is used herein in to generally denote the distribution of light formed by first transmitted light beam 24P' at image plane IP and wafer surface WS residing therein.

In an example embodiment, line image 80 is scanned over wafer surface WS, as indicated by arrow 180, resulting in localized rapid heating of the wafer surface (down to a depth of about 100 microns or less) up to an annealing temperature (e.g., between 1000° C. and 1,300° C. for a non-melt process and in excess of the melt temperature of silicon of about 1,400° C. for a melt process) sufficient to activate dopants in the source and drain regions 150S and 150D, while also allowing for rapid cooling of the wafer surface so that the dopants do not substantially diffuse, thereby maintaining the shallowness of the source and drain regions. Blanket dopant activation of wafer surface WS can also be performed using laser annealing system 100. A typical scan velocity of line image 80 over wafer surface WS ranges from 25 mm/sec to 1000 mm/sec. In an example, one or both of light beam 24P' and wafer W can move during scanning.

Because line-forming optical system 10 can form a relatively long line image 80 having a relatively large power density, wafer W can be scanned much faster (e.g., up to 3× faster or have 3× longer process line for 3× throughput improvement) than previous line-image forming optical systems would allow, thereby increasing the number of wafer per hour that can be processed by laser annealing system 100.

Defect and Spike Annealing Systems and Methods

Aspects of the disclosure include systems and methods for performing defect annealing, or defect annealing and spike annealing using the line-forming optical system 10 disclosed herein. FIG. 7 is similar to FIG. 6 and discloses another embodiment of laser annealing system 100 that includes the $CO_2$-laser-based line-forming optical system 10 as disclosed herein to perform defect annealing and also includes a diode-based line-forming optical system 200 used to perform the spike annealing. The diode-based line-forming optical system 200 is operably connected to controller 170 and includes a laser diode light source 220 that emits a light beam 222 of wavelength $\lambda_2$. The diode-based line-forming optical system 200 also includes line-forming optics 223 arranged to receive light beam 222 and form a light beam 224 that forms a line image 280 at wafer surface WS. In an example, wavelength $\lambda_2$ is in the visible and near-infrared range, e.g., 380 nm≤$\lambda_2$≤1000 nm, while in another example is in the visible range only, e.g., 500 nm≤$\lambda_2$≤900 nm. The line-forming optics 223 can include one or more optical elements, which can be refractive, reflective, diffractive, etc. In an example, line-forming optics is anamorphic, and further in an example is or includes a cylindrical optical system. In an example, line image 280 has an intensity uniformity within +/−5% over its length.

In an example, line image 280 overlaps with line image 80, as illustrated in FIG. 7 and as shown in the close-up view of FIG. 8A. In another example, line image 280 fits within line image 80, as shown in FIG. 8B. In another example, most of line image 280 fits within line image 80 formed by the $CO_2$-laser-based line-forming optical system 10 while some of line image 280 falls outside of line image 80, as shown in FIG. 8C. In an example, line image 280 is substantially more narrow than line image 80, and further in an example has a width in the range from 25 microns to 250 microns, or in the range from 50 microns to 150 microns. In an example, width of line image 280 is between 5% and 25% of the width of line image 80. In an example, line image 80 and line image 280 have about the same length, which in one example is in the range from 5 mm to 100 mm. In an example, the width of line image 80 is about 1 mm and the width of line image 280 is in the range of 50 microns and 150 microns. In an example, line images 80 and 280 at least partially overlap.

In an example, light beam 24P' delivers between 2000 W and 3000 W of optical power to wafer surface WS via line image 80. As noted above, line image 80 can have a width of up to about 1 mm. In the example of FIG. 7, light beam 24P' and line image 80 are used to perform defect annealing by scanning the line image over the wafer surface WS to locally raise the temperature of the wafer surface WS to a defect anneal temperature $T_D$, which in an example is 1050° C. In practice, the defect annealing temperature is related to the duration of the anneal, i.e., the dwell time of line image 80. Typically, longer defect annealing times require lower temperatures. In an example, the defect annealing times $t_D$ can range from 2 milliseconds to 15 milliseconds, with corresponding defect anneal temperatures $T_D$ ranging in one example from about 1000° C. to 1150° C. for $t_D$=2 milliseconds, and in another example ranging from 700° C. to 1000° C. for $t_D$=15 milliseconds. In an example, the anneal temperature $T_D$ is in the range 650° C.$\leq T_D \leq$1100° C.

The light beam 224 and line image 280 from diode-based line-forming optical system 200 is used to perform spike annealing of wafer W. In an example, the laser diode light source 220 generates a relatively small amount of optical power, e.g., 300 to 500 W. There are two main reasons why so little diode laser power is needed. The first reason is that the temperature jump from the defect anneal temperature TD to the activation temperature $T_A$ is small, e.g., a few hundred degrees centigrade. The second reason is that the absorption length of the diode laser visible wavelength $\lambda_2$ as compared to the $CO_2$ laser infrared wavelength $\lambda_1$ is typically 100× shorter. Hence, a laser with a substantially smaller optical power output can be used for the laser spike annealing as compared to the conventional approach where the $CO_2$ laser is used to perform laser spike annealing. Because much less diode laser power is being used than in the conventional approach, there is much less risk to damaging the edge of the wafer. In the conventional approach, 2 to 3 kW of diode laser power needs to be delivered by light beam 224 and line image 280. With the system and methods disclosed herein, roughly 200 to 500 watts of diode laser power can be employed, depending on the required amount of heat needed to raise the temperature from the defect anneal temperature $T_D$ to the spike anneal (or dopant activation) temperature $T_A$ and the size and scanning speed of line image 280.

In an example, line image 280 has a width in the scan direction of between 50 and 150 microns. In an example, diode-based line-forming optical system 200 is optical-fiber based, as described for example, in the aforementioned U.S. patent application Ser. No. 14/497,006.

The diode-based line-forming optical system 200 is arranged such that line image 280 at least partially overlaps with line image 80, as described below. The optical power provided by light beam 224 and line image 280 is used to locally raise the temperature of wafer surface WS from the defect anneal temperature $T_D$ (e.g., of about 1050° C.) to a spike anneal (or dopant activation) temperature $T_A$, which in an example is approximately 1150° C. to 1350° C.

Because this temperature rise of a few hundred degrees or so is performed using light beam 224 at wavelength $\lambda_2$, there is up to about a 20% pattern temperature non-uniformity (e.g., up to about 60° C.) due to pattern effects. This amount of non-uniformity a substantial improvement over the prior art for which the temperature non-uniformity from pattern effects can be as large as 160° C. Thus, the laser annealing system 100 and methods of annealing using this system can improve temperature uniformity during spike annealing. In an example, this improvement can be about 25% or more, e.g., between about 25% and 40%. Typical dwell times for the spike annealing using line image 280 can range from between 200 microseconds and 800 microseconds. The width of line image 280 determines the scanning speed (e.g., the stage velocity).

As noted above, an added benefit of using a visible wavelength $\lambda_2$ for carrying out the spike annealing is that the light beam 224, which in an example irradiates the side of wafer W during scanning, has relatively low power, which significantly reduces the probability of damage to the wafer and in particular reduces the chances of wafer breakage.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A system for performing defect annealing of a semiconductor wafer having a surface with a pattern, comprising:
  a $CO_2$ laser source that emits an initial light beam having a wavelength of nominally 10.6 microns;
  a beam-conditioning optical system that receives the initial light beam and forms therefrom a conditioned light beam having a first intensity profile with a Gaussian distribution in at least a first direction;
  a first aperture device operably disposed at an object plane and that defines a first slit aperture that truncates the first intensity profile in the first direction to define first transmitted light that constitutes at least 50% of the conditioned light beam;
  a relay optical system that defines the object plane and that also defines an intermediate focal plane at which is operably disposed a second aperture device, the relay optical system defining at the intermediate focal plane a second intensity profile having a central peak and first side peaks immediately adjacent the central peak, wherein the second aperture device is configured to truncate the second intensity profile in the first direction and within each of the first side peaks to define second transmitted light;
  wherein the relay optical system forms from the second transmitted light a first line image at the wafer surface, wherein the first line image includes between 2000 W and 3000 W of optical power, has a first length in the range from 5 mm to 100 mm, and has an intensity uniformity of within +/−5%;

a chuck that operably supports the wafer; and a moveable wafer stage that operably supports the chuck and that is configured to move the chuck and the wafer supported thereon so that the first line image scans over the wafer surface to locally raise a temperature of the wafer surface to a defect anneal temperature.

2. The system according to claim 1, wherein the defect anneal temperature is in the range from 650° C. to 1100° C.

3. The system according to claim 1, wherein the chuck is heated so that it can pre-heat the wafer.

4. The system according to claim 1, further including a diode-based line-forming optical system that generates a visible light beam that forms at the wafer surface a second line image that at least partially overlaps and scans with the first line image to locally raise the temperature of the wafer surface from the defect annealing temperature to a spike anneal temperature, and wherein the second line image has an intensity variation of within +/−5%.

5. The system according to claim 4, wherein the spike anneal temperature is in the range from 1150° C. to 1350° C.

6. The system according to claim 4, wherein the first and second line images have respective first and second widths, and wherein the second width is in the range from 5% to 25% of the first width.

7. The system according to claim 1, wherein each side peak is defined by a maximum value MX and first and second minimum values m1 and m2, and wherein the second slit aperture is configured to truncate the second intensity profile between the maximum value MX and the second minimum value m2 in each first side peak.

8. The system according to claim 1, wherein the relay optical system has substantially 1× magnification in the first direction.

9. The system according to claim 8, wherein the relay optical system is a cylindrical optical system having optical power only in the first direction.

10. The system according to claim 1, wherein the optical relay system consists of reflective optical components only.

11. The system according to claim 1, wherein the first aperture device comprises a pair of blades operably disposed in the object plane.

12. The system of claim 1, wherein the second aperture device comprises a pair of blades operably disposed in the intermediate focus plane.

13. The system of claim 4, wherein the diode-based line-forming optical system includes a laser diode light source and line-forming optics arranged relative thereto.

* * * * *